US005258760A

United States Patent [19]

[11] Patent Number: 5,258,760

Moody et al.

[45] Date of Patent: Nov. 2, 1993

[54] DIGITALLY DUAL-PROGRAMMABLE INTEGRATOR CIRCUIT

[75] Inventors: Kristaan L. Moody, Nottingham; Paul W. Latham, II, Lee, both of N.H.

[73] Assignee: Allegro Microsystems, Inc., Worcester, Mass.

[21] Appl. No.: 912,386

[22] Filed: Jul. 13, 1992

[51] Int. Cl.[5] .............................................. H03M 1/50

[52] U.S. Cl. ..................................... 341/166; 341/155

[58] Field of Search ............... 341/155, 166, 167, 168, 341/169, 170

[56] References Cited

U.S. PATENT DOCUMENTS 4,489,063 2/1985 Makabe et al. ...................... 333/173
4,764,753 8/1988 Yukawa ............................... 341/166
5,012,808 5/1991 Stubbers et al. ................ 128/419 R

OTHER PUBLICATIONS

An Electrically-Programmable Switched Capacitor Filter, David J. Allstot et al., IEEE Jrnl. of Solid State Ckts., vol. SC-14, No. 6, Dec. 1979.

*Primary Examiner*—A. D. Pellinen
*Assistant Examiner*—Brian K. Young

[57] ABSTRACT

Analog-signal integrators are described that have a transfer function containing a composite parameter that is the product of two parameters each of which is separately changeable, via application of digital programming signals. In a continuous analog-signal integrator the integrating capacitor is a programmable capacitor array, preceded in the feed back branch with a programmable voltage divider. In a discrete-time analog-signal integrator the integrating resistor is a switched-capacitor resistor including a programmable capacitor array that is preceded in the input circuit branch by a programmable voltage divider.

6 Claims, 2 Drawing Sheets

DIGITALLY DUAL-PROGRAMMABLE INTEGRATOR CIRCUIT

BACKGROUND

This invention relates to digitally programmable analog-signal manipulating circuits and more particularly to programmable integrator circuits having an analog transfer function comprised of variables and parameters wherein the value of each one of a pair of the parameters is capable of being set and or altered to a desired value by introducing a digital signal at a corresponding group of programming terminals.

A simple example of a digitally programmable analog-signal manipulating circuit is a standard digital to analog converter (DAC) employed in an unconventional manner to provide a programmable voltage divider (PVD). Standard DAC circuits are described by L. P. Huelsman, J. G. Graeme and G. E. Tobey at pages 336–339 in their book Operational Amplifiers, McGraw Hill, 1971. Such a PVD is further described herein below.

Another example of a digitally programmable analog-signal manipulating circuit is described D. J. Allstot, R. O. Brodersen and P. R. Gray in their paper entitled An Electrically-Programmable Switched Capacitor Filter, published in the IEEE Journal of Solid-State Circuits, Vol. Sc-14, No. 6, December 1979, pages 1034–1041. There, the analog-signal manipulating circuit is a second-order filter employing active integrators connected in tandem. The integrating (feedback) capacitor in each integrator consists of a digitally programmable capacitor array so that the filter transfer function has programmable poles. It is also known to use a fixed resistors voltage divider preceding the integrator resistor.

It is an object of this invention to provide a digitally programmable analog-signal manipulating circuit having a transfer function containing the product of two separately programmable parameters, one parameter being rendered programmable by electrically altering the value of a capacitor and the other by electrically altering the ratio of a voltage divider.

SUMMARY

A dual programmable switched-capacitor-resistor integrator includes integrator input and output conductors, an operational amplifier having a negative input, an integrating resistor of the switched-capacitor type having one end connected to the amplifier input, an integrating capacitor connected between the output of the amplifier and the amplifier input, the amplifier output being connected to the integrator output conductor, the switched capacitor of the integrating switched-capacitor-resistor being a programmable capacitor array having a first group of digital-signal programming terminals, a programmable voltage divider having a second group of digitally programming terminals, having an input connected to the integrator input conductor and having an output connected to the other end of the switched-capacitor-resistor, so that the transfer function of the integrator contains the product of a parameter M and a parameter N that are separate functions respectively of the digital signals applied to the first and second groups of digital programming terminals. This discrete-time integrator advantageously makes it possible to extend the range of possible RC integration time constants without increasing the ratio of the integrated circuit areas occupied by the switched capacitor and the array capacitors in comparison with use of a fixed voltage divider.

In another aspect of the invention, a dual programmable switched-capacitor-resistor integrator includes integrator input and output conductors, an operational amplifier having a negative input, an integrating resistor connected between the integrator input conductor and the amplifier input, an integrating capacitor having one end connected the amplifier input, the integrating capacitor being a programmable capacitor array having a first group of digital programming terminals, the amplifier output being connected to the integrator output conductor, a programmable voltage divider having a second group of digitally programming terminals, having an input connected to the amplifier output and having an output connected to the other end of the integrating capacitor, so that the transfer function of the integrator contains the product of a parameter M and a parameter N that are separate functions respectively of the digital signals applied to the first and second groups of digital programming terminals. Not only is the RC integration time constant of this integator programmable in operation, but the dual-programmable feature permits a calibration adjustment of the integrator constant to compensate for component parameter variations at manufacturing, variations in the resistance of a poly-silicon integration resistor.

DESCRIPTION OF THE PREFERRED EMBODIMENTS

Figure 1:
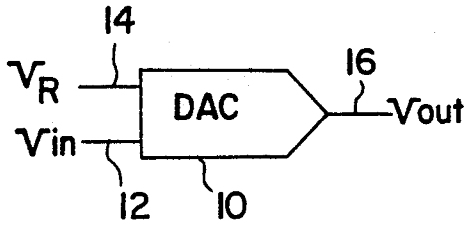
FIG.1 PRIOR ART
FIG. 1 shows the symbol for a conventional digital to analog converter (DAC).

Digitally programmable voltage divider circuits may be obtained by using standard digital-to-analog circuits (DAC's) in voltage mode. A conventional symbol 10 representing a DAC is shown in FIG. 1, with a DC voltage reference terminal 14, an analog-signal output terminal 16 and a ground terminal 12. The DAC composite digital input terminal (not shown) consists of a group of input conductors for parallel application thereto of the digital input signal.

Figure 2:
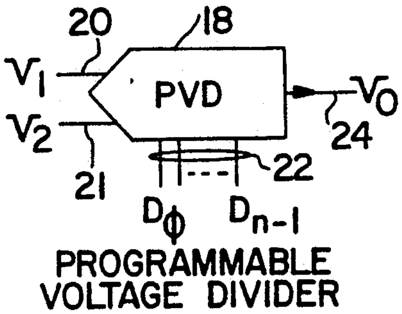
FIG. 2 shows a symbol representing a digitally programmable voltage divider (PVD).

The symbol 18 of FIG. 2 is used herein to represent a digitally programmable voltage divider (PVD). The PVD input terminal 20 was the DAC reference voltage terminal 14, the PVD group of digital programming terminals 22 was the DAC composite digital input terminal, and the PVD output terminal 24 was the DAC output terminal 16. A terminal 21 is the PVD circuit "ground" that was the DAC ground terminal 12.

Figure 3:
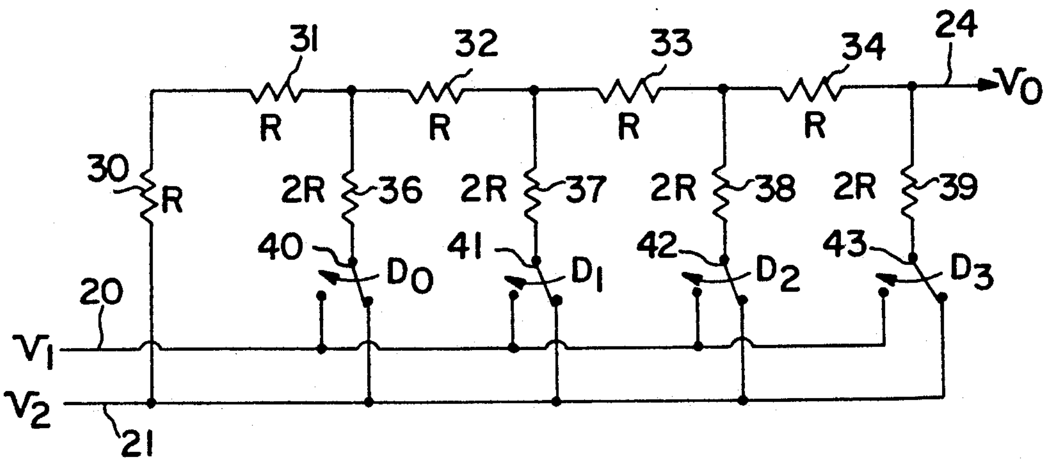
FIG.3 PRIOR ART
FIG. 3 shows a particularly suitable PVD circuit for use in the dual-programmable circuit of this invention.

The preferred PVD circuit shown in FIG. 3 is a voltage-mode connected conventional "R/2R" DAC. The resistors 30, 31, 32, 33 and 34 each have a resistance value R. The resistors 36, 37, 38 and 39 each have a resistance value 2R. The digital-signal-activated switches 40, 41, 42 and 43 are preferably implemented as MOS transistors (not shown). A switch to which a binary zero is applied is connected to the ground terminal 21 as shown, and a switch to which a binary 1 is applied is connected to the input terminal 22. Thus for example, when the digital programmable signal is 1/0/0/1 is applied to programming terminals 22, only switches 40 and 43 are connected to the input terminal 20 while the switches 41 and 42 are connected to the ground terminal 21. The corresponding decimal number is $N=D0+2D1+4D2+8D3=1\cdot1+2\cdot0+4\cdot0+8\cdot1=9$.

This R/2R programmable voltage divider advantageously has a Thevenin equivalent output source impedance equal to R ohms no matter how the switches are set.

The PVD output voltage Vout is seen to be a function of both the analog input voltage Vin and the digital programming control signal, according to $$Vout = V_2 + (Vin - V_2)\frac{D0 + 2D1 + 4D2 + 8D3}{16} = V_2 + (Vin - V_2)\frac{N}{2^n}$$

where n is the number of binary bits capacity of the programming terminal 22 and N is the decimal number corresponding to the digital programming signal applied to the programming terminal 22. Note that when the voltage $V_2$ at terminal 21 is zero, the divider output voltage Vout is always directly proportional to the input voltage Vin, and $$\frac{Vout}{Vin} = \frac{N}{2^n}.$$

Figure 4:
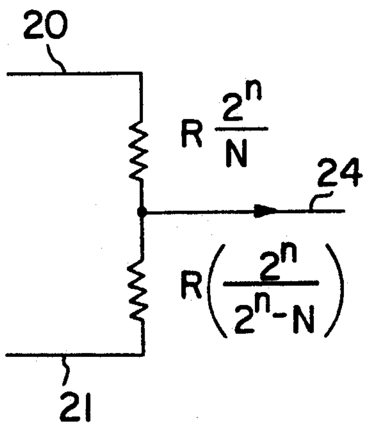
FIG. 4 shows a simple voltage divider circuit that is equivalent to the PVD of FIG. 3 for any number of digital programming bits n and any given digital programming signal, m.

In the case n=4, N is an integer less than 16. FIG. 4 shows the resulting generic equivalent circuit.

Figure 5:
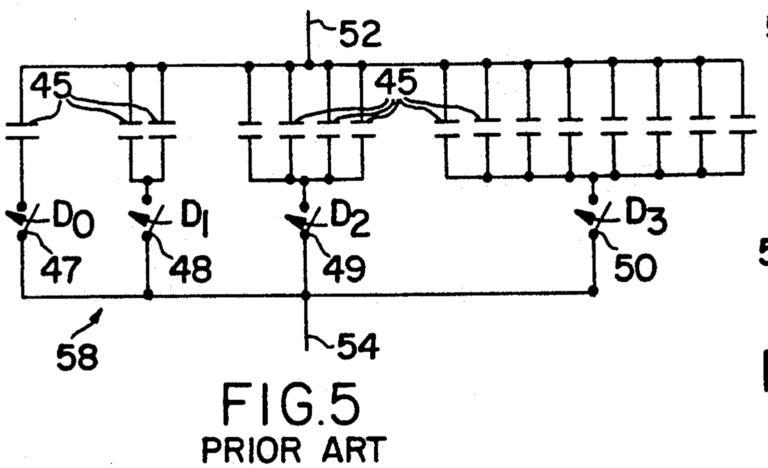
FIG.5 PRIOR ART
FIG. 5 shows a circuit diagram of a suitable digitally programmable capacitor array for use in the dual-programmable circuit of this invention.

The digitally programmable capacitor array of FIG. 5 is binarily weighted. All of the capacitors 45 have the same capacitance value, C, and they are connected in binary groups of 1, 2, 4, etc. Electrically programmable switches 47, 48, 49 and 50 determine which groups of capacitors 45 contribute to the capacitance $C_A$ of the array as measured between terminals 52 and 54, and $$C_A=(D0+2D1+4D2+8D3)C$$

More generally $C_A$=MC, wherein M is the decimal number corresponding to the digital programming signal that sets the switches 47 through 50. Here, the number of array programming bits, m, is just 4 whereas a greater number of bits will usually be preferred. M can be any integer between 0 and $2^{m-1}$, so for m=4, M can be any integer between 0 and 15.

Figure 6:
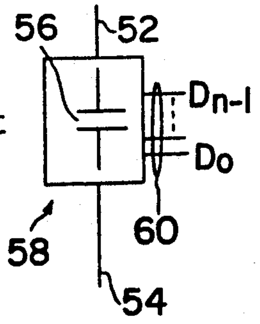
FIG. 6 shows a symbol representing a digitally programmable capacitor array.

The programmable capacitor array of FIG. 5 may be more simply represented by the symbol 58 of FIG. 6, wherein the programmed-array capacitor 56 has the value $C_A$, and the group of digital programming terminals is 60.

Figure 7:
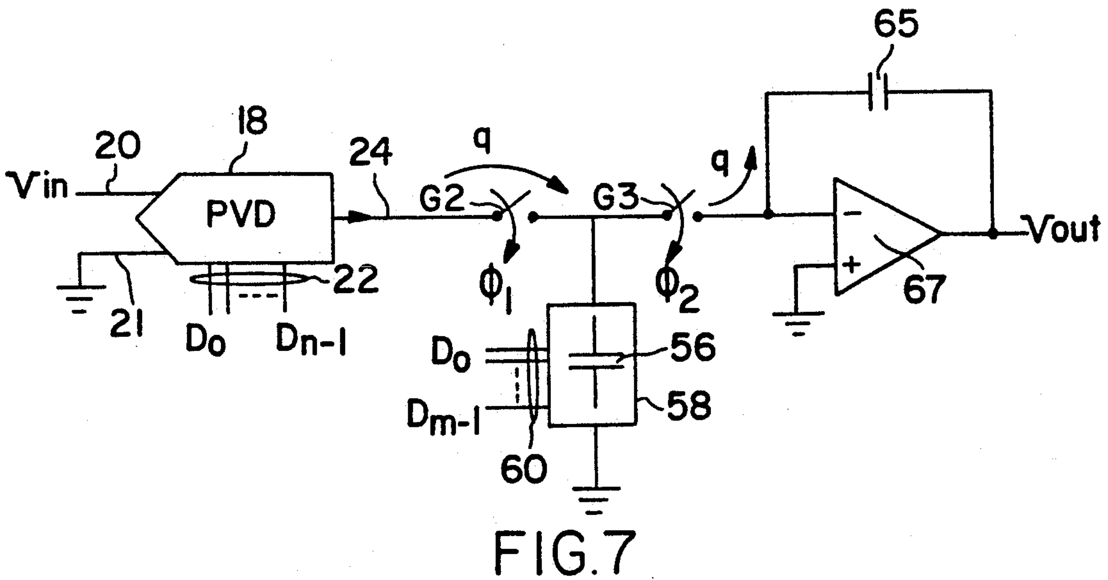
FIG. 7 shows a circuit diagram of a first preferred embodiment of a dual-programmable analog-signal integrator circuit of this invention.

The programmable analog-signal manipulating circuit of FIG. 7 is a programmable discrete-time analog-signal integrator, e.g. employing a switched-capacitor resistor. The integrating resistor is a switched-capacitor resistor made up of the programmable capacitor array 58 of FIG. 5 and the two clocked switches 62 and 63. A similar switched-capacitor resistor is employed in the integrator circuit described by Makebe et al, in the patent U.S. Pat. No. 4,498,063 issued Feb. 5, 1985, except that the integrator in FIG. 7 further includes the fixed integrating feedback capacitor 65 and an operational amplifier 67. The programmable voltage divider 18 of FIGS. 2 and 3 is connected at the input of the integrator.

At the end of any first half-clock period (phase $\phi1$), during which switch 62 is closed, for an instantaneous output voltage $v_R(t)$ at the output terminal 24 of the PVD 18, a charge q will have flowed through closed switch 62 into capacitor 56 of capacitance $C_A$. The same charge q will flow from the array capacitor 56 into the feedback capacitor 65 (of capacitance $C_F$) during the subsequent second half-clock period (phase $\phi2$) during which switch 63 is closed. This is more accurate for the conditions that the RC time constant of the PVD 18 and the array capacitor 65 (namely $R\cdot C_A$) is much less than the clock frequency $f_c$, e.g. preferably less by a factor of 10.

The feedback capacitor 65 is preferably made up of a plurality of identical capacitors of the same construction and capacitance C as the capacitors 45 making up the capacitor array 58 of FIGS. 5 and 6, because in an integrated circuit, simultaneously manufactured capacitors of the same kind and size lead to better repeatability and predictability of capacitance ratios, e.g. $C_A/C_F$. Therefore in this embodiment, the fixed capacitance CF is set at the value $2^mC$, where m is the number of digital programming bits of the programmable capacitor array 58. Since for any given clock period the charges q in and out of the array capacitor 56 are the same, the charge transfer equations are:

$$q = v_{in}\frac{N}{2^n}MC = -v_{out}2^mC, \text{ leading to}$$

$$v_{out} = \frac{N}{2^n}\,\frac{MC}{2^mC}\,v_{in},$$

$$\frac{vout}{v_{in}} = -\frac{MN}{2^{n+m}}$$

wherein $v_{in}$ and $v_{out}$ are respectively the instantaneous input and output voltages of the entire circuit of FIG. 7 during any full clock period.

The transfer function, in Laplace form, of the switched capacitor integrator circuit which is preceded by the PVD is:

$$\frac{V_{out}(S)}{V_{in}(S)} = \frac{N}{2^n}f_c\frac{C_A}{C_F}\,\frac{1}{S}, \text{ and}$$

$$\frac{C_F}{C_A} = \frac{MC}{2^mC} = \frac{M}{2^m}, \text{ leading to}$$

$$\frac{V_{out}(S)}{V_{in}(S)} = \frac{MN}{2^{n+m}}f_c\frac{1}{S}.$$

This last equation is the transfer function of the integrator circuit of FIG. 7. In it there appears the product of MN, the two decimal numbers corresponding respectively to the two digital-program inputs to the PVD 18 and the capacitor array 58. M and N are thus transfer-function parameters forming in the transform function a product MN which in turn is a composite parameter of the transfer function. Thus, for example, M may be decreased to provide a lower switching-capacitor capacitance $C_A$ while N is correspondingly increased for keeping the transfer function constant. Or, the user may similarly increase the clock frequency $f_c$ without affecting transfer function gain.

Figure 8:
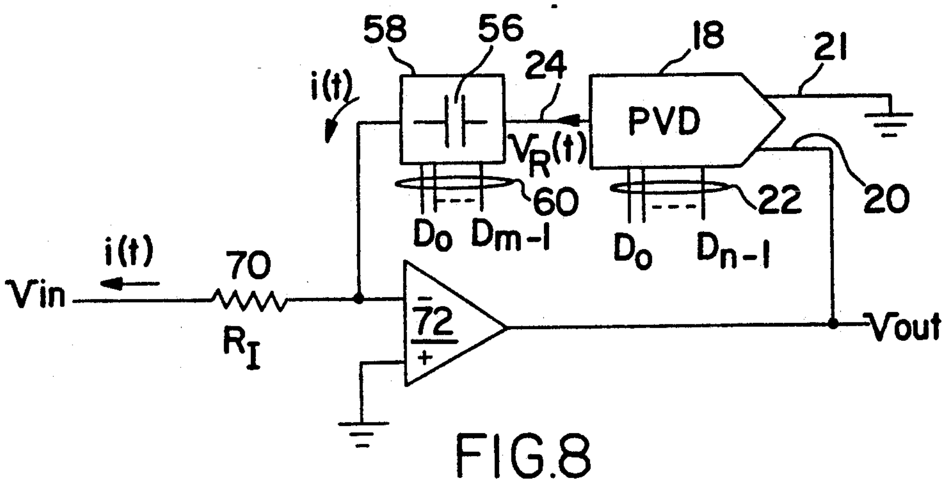
FIG. 8 shows a circuit diagram of a second preferred embodiment of a dual-programmable analog-signal integrator circuit of this invention.

The programmable analog-signal manipulating circuit of FIG. 8 is a programmable continuous analog-signal integrator. The integrating resistor 70, of $R_I$ ohms is a resistor, e.g. an integrated-circuit polysilicon resistor or silicon diffused resistor. A programmable voltage divider (PVD) 18 is connected between the output of the operational amplifier 72 and a programmable integrating feedback capacitor 58 having the capacitance $C_A$=MC.

We will assume in the following analysis that the highest frequency of interest of the analog output signal, $v_{out}(t)$, is much greater than the inverse time constant, which is the array capacitance $C_A$ times the PVD output resistance R. The current i(t) flowing from the integrating array capacitor 56 into the integrating resistor 70 at any time t is $$i(t) = MC\frac{dv_R(t)}{dt},$$

where $v_R$ is the PVD output voltage. In Laplace form $$I(S) = MCV_R(S)S, \text{ but}$$

$$V_R(S) = \frac{N}{2^n} V_{out}(S), \text{ and therefore}$$

$$I(S) = \frac{N}{2^n} V_{out}(S)MCS.$$

Let the transconductance $$Z_f = -\frac{V\text{out}(S)}{I(S)} = -\frac{2^n}{C}\frac{1}{S}\frac{1}{MN}.$$

$$V_{in}(S) = I(S)R_I, \text{ and}$$

$$\frac{V_{out}(S)}{V_{in}(S)} = -\frac{Z_f(S)}{R_I} = -\frac{2^n}{CR_I}\frac{1}{S}\frac{1}{NM}.$$

Here again the transfer function contains a composite parameter that is the product NM of two independently programmable parameters N and M, or from another point of view the product of parameter 1/N times parameter 1/M.

The programmable discrete-time integrator of this invention is especially well suited as one of the analog-signal manipulating circuits (ASMCs) employed in the key integrated circuit servo co-processor described in the patent application Ser. No. 07/912,387 filed concurrently herewith entitled HYBRID CONTROL-LAW SERVO CO-PROCESSOR INTEGRATED CIRCUIT, of the same inventive entity and assigned to the same assignee as is the present invention. Uses and additional advantages of this integrator circuit are described in that co-filed application and that co-filed application is hereby incorporated by reference herein.

We claim:

1. A dual programmable discrete-time integrator comprising input and output conductors; an operational amplifier; an integrating switched-capacitor-resistor circuit having one end connected to said amplifier input; an integrating capacitor connected between the output of said amplifier and said amplifier input, said amplifier output being connected to said integrator output conductor, the switched capacitor of said integrating switched-capacitor-resistor circuit being a programmable capacitor array having a first group of digital-signal programming terminals; a programmable voltage divider (PVD) having a second group of digitally programming terminals, said PVD having an input connected to said integrator input conductor and having an output connected to said other end of said switched-capacitor-resistor circuit, so that the transfer function of said dual programmable integrator is proportional to the product of the independently programmable numbers M and N, wherein the decimal number N is proportional to the PVD voltage-divider ratio that corresponds to the digital signal that may be applied to said first group of digital programming terminals, and wherein the decimal number M is proportional to the capacitance of said programmable capacitor array that corresponds to the digital signal that may be applied to said second group of digital programming terminals.

2. A dual programmable integrator comprising integrator input and output conductors; an operational amplifier; an integrating resistor connected between said integrator input conductor and said amplifier input; an integrating capacitor having one end connected to said amplifier input, said integrating capacitor being a programmable capacitor array having a first group of digital programming terminals, said amplifier output being connected to said integrator output conductor; a programmable voltage divider having a second group of digitally programming terminals, said PVD having an input connected to said amplifier output and having an output connected to said other end of said integrating capacitor, so that the transfer function of said dual programmable integrator is proportional to the reciprocal of the product of the independently programmable numbers M and N, wherein the voltage-divider ratio is proportional to the decimal number N that corresponds to the digital signal that may be applied to said first group of digital programming terminals wherein the capacitance of said programmable capacitor array is proportional to the decimal number M that corresponds to the digital signal that may be applied to said second group of digital programming terminals.

3. An integrated-circuit dual-programmable integrator comprising:

a) an integrator input conductor and output conductor;
b) an operational amplifier having an input, and having an output connected to said integrator output conductor;
c) a series-circuit feedback branch connected between said amplifier output and said amplifier input, said feedback branch including an integrating capacitor having one end directly connected to said amplifier input;
d) a series-circuit integrator-input branch connected between said integrator input conductor and said amplifier input, said integrator input branch including an integrating resistor having one end connected to said amplifier input; and e) a digitally programmable voltage divider (PVD) having a divider input, a divider output and a first group of digital programming terminals, wherein the voltage-divider ratio is proportional to the decimal number N that corresponds to the digital signal that may be applied to said first group of digital programming terminals;

f) a digitally programmable electrical component having a second group of digital programming terminals wherein the value of said programmable component is proportional to the decimal number M that corresponds to the digital signal that may be applied to said second group of digital programming terminals, g) wherein one of said resistor and capacitor is said digitally programmable component which is connected in series with said PVD, so that the transfer function of said dual programmable integrator is a function of the product of the independently programmable numbers M and N.

4. The dual programmable integrator of claim 3 wherein the other end of said programmable component is connected directly to the output of said PVD.

5. The dual programmable integrator of claim 3 wherein said programmable component is said programmable resistor which is a switched-capacitor-resistor circuit including a switched capacitor composed of a digitally programmable capacitor array.

6. The dual programmable integrator of claim 3 wherein said programmable component is said programmable capacitor which is a digitally programmable array.

* * * * *